United States Patent [19]
Krajec et al.

[11] Patent Number: 6,067,866
[45] Date of Patent: May 30, 2000

[54] REMOVABLE FIXTURE ADAPTER WITH PNEUMATIC ACTUATORS

[75] Inventors: Russell S. Krajec, Berthoud; Richard J. Chapman, Westminster, both of Colo.

[73] Assignee: Hewlett-Packard Company, Palo Alto, Calif.

[21] Appl. No.: 09/026,066

[22] Filed: Feb. 19, 1998

[51] Int. Cl.⁷ .................................................. H04B 17/00
[52] U.S. Cl. ............................................................ 73/865.9
[58] Field of Search .................................. 73/431, 865.6, 73/865.8, 865.9; 324/511, 555; 379/1, 6

[56] References Cited

U.S. PATENT DOCUMENTS 4,812,754  3/1989  Tracy et al. .

*Primary Examiner*—Robert Raevis

[57] ABSTRACT

The inventive fixture adapter has installed pneumatic actuators. Pneumatic connections for the actuators are made during installation of the adapter in the fixture. Thus, testing of a device can begin before the drawer is closed, and be completed while the drawer is being opened, thus saving cycle time. The adapter is removably connected to the drawer mechanism of the fixture, and thus can quickly and reliably be changed for a different adapter. All of the customization required for a particular device can be confined to the adapter, and thus the reset of the fixture can be made generic.

17 Claims, 3 Drawing Sheets

— 1 —

REMOVABLE FIXTURE ADAPTER WITH PNEUMATIC ACTUATORS

REFERENCE TO RELATED APPLICATIONS

The present application is being concurrently filed with commonly assigned U.S. patent applications Ser. No. 09/026,065 entitled "QUICKLY REMOVABLE RF SEALED COVER FOR TEST FIXTURE", the disclosure of which is incorporated herein by reference; Ser. No. 09/025,982 entitled "DOCKING STATION FOR AUTOMATED COMMUNICATIONS TEST FIXTURE", the disclosure of which is incorporated herein by reference; Ser. No. 09/026,307 entitled "DRAWER STYLE FIXTURE WITH INTEGRAL RF DOOR", the disclosure of which is incorporated herein by reference; Ser. No. 09/026,083 entitled "REMOVABLE FIXTURE ADAPTER WITH RF CONNECTIONS", the disclosure of which is incorporated herein by reference.

TECHNICAL FIELD OF THE INVENTION

This application relates in general to automatic testing machines, and in specific to an adapter for a test fixture of an automatic testing machine which includes pneumatic actuators on the adapter.

BACKGROUND OF THE INVENTION

An automatic testing machine (ATM) operates in a production environment to rapidly and accurately test the operation and performance of various types of devices under test (DUT), including RF communication devices. The DUTs could be a finished product or a component of a larger system.

The ATM is programmed to perform various tests on the DUT automatically. For example, RF signals are transmitted to a finished cellular telephone DUT to determine if the telephone activates. Other tests could include environmental tests, such as temperature or vibration tests.

Depending upon the nature and number of the tests being performed, the testing may last from a couple of milliseconds to several minutes. The information from the testing is compared with expected test results. If there is some defect so that the DUT falls below specifications, the ATM will designate the DUT as failed, either by marking the DUT, placing the DUT in a failure area, or indicating the failure to an operator.

The ATM is then loaded with the next DUT, either manually or automatically, and the testing procedure is repeated for this DUT. This test information can be used to evaluate the fabrication process for possible changes, as well as to perform failure analysis on individual failed devices.

Typically, each ATM is designed to perform a specific class of tests on the DUT, and are not able to perform other classes of tests. For example, a vibration ATM may not be able to perform electrical signal tests. However, different types of DUTs may require the same tests to be performed. For example, all types of microcomputer chips are tested for electronic performance characteristics, but different chips will have different locations for power, inputs and outputs. ATMs are made flexible by the use of test fixtures. The test fixture provides an interface between the device under test DUT and the ATM. Thus, a single ATM can perform tests on different types of devices when connected via different fixtures.

Fixtures typically have a drawer mechanism, which opens up and allows the DUT to be placed inside the fixture. The fixture uses pneumatic actuators that are precisely placed to clamp and hold a particular DUT. Pneumatic actuators are used to mechanically manipulate the DUTs. Pneumatic actuators and their air supplies, are hardwired or constructed directly onto the drawer mechanism. The hardwired aspects makes fixtures extremely difficult to reconfigure, because all of the fixture elements are integrally built into the fixture.

Moreover, fixtures tend to be large and bulky. Also, they have numerous connections to the ATM for the required resources to allow testing, e.g. power, electronic signals, RF signals, and pneumatic air pressure. Thus changing fixtures is time consuming, as each individual connection to the ATM must be separated, the current fixture removed, and then the new fixture installed. During the replacement process, the production line is shut down, which results in lost production time. If the fixture needs to be repaired, then this process must be undertaken, and the lost production time is unavoidable. However, if the fixture is to be changed merely to accommodate a different DUT, then the lost production time can be mitigated by using an adapter. An adapter is a DUT holder that is coupled to the fixture on the drawer mechanism. The adapter is customized to hold a specific type of DUT. If a different DUT needs to be tested then the adapter in the fixture is swapped for the proper adapter.

However, the adapter does not have any pneumatic actuators and they are completely passive. They merely hold the DUT or act as a nest for the DUT. The pneumatic actuators are connected to the fixtures. The adapter may have levers, slides, or catches that are operated by pneumatic actuators, but the actuators themselves are located within the fixture. Consequently, the pneumatic actuators do not begin operation until the drawer mechanism is closed. Thus, the DUT cannot be clamped down or manipulated until the drawer of the fixture is closed. Consequently, valuable production time is lost waiting for the drawer to close before beginning testing operations.

Therefore, there is a need in the art for a system and method that allows for the rapid and reliable conversion of an ATM to test a different DUT, and at the same time reduce the cycle time required for testing by allowing testing to begin before the drawer mechanism has closed in a production environment.

SUMMARY OF THE INVENTION

These and other objects, features and technical advantages are achieved by a system and method that uses a fixture adapter that has pneumatic actuators installed on the adapter, and pneumatic connections for the actuators are made during installation of the adapter in the fixture. Consequently, testing can begin before the drawer is closed, particularly, initial steps such a pneumatically clamping down the fixture, making connections to the DUT, and turning on the DUT. Similar operations can occur during the completion of testing while the drawer is being opened, i.e., unclamping, breaking connections, and turning off the DUT. This can save about 5 seconds of production time per cycle. The adapter is removable from the drawer style fixture, and thus can be quickly and reliably changed for a different adapter for another DUT or to perform maintenance on the current adapter.

The adapter allows all of the customization required for a certain product or DUT to be confined to one removable piece which can be quickly changed for a different DUT. This allows the rest of the fixture to be generic. Moreover, the adapter can have more custom features than a prior are fixture could, since prior art fixtures were built to be more generic than the inventive adapter. Having actuators on the adapter allows much more flexibility in performing actions on the DUT with the drawer opened or closed. If the actuators are installed in the fixture, they must be placed outside of the envelope of the adapter, thus requiring a wider fixture for the extra space. Consequently, the adapter with actuators allows for a more compact fixture.

A technical advantage of the present invention is reduction in downtime and errors caused by changing fixtures to test a different device.

Another technical advantage of the present invention is the reduction in cycle time as testing can begin before the drawer mechanism of the fixture is closed.

A further technical advantage of the present invention is that all customization required for a particular DUT is located on the adapter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
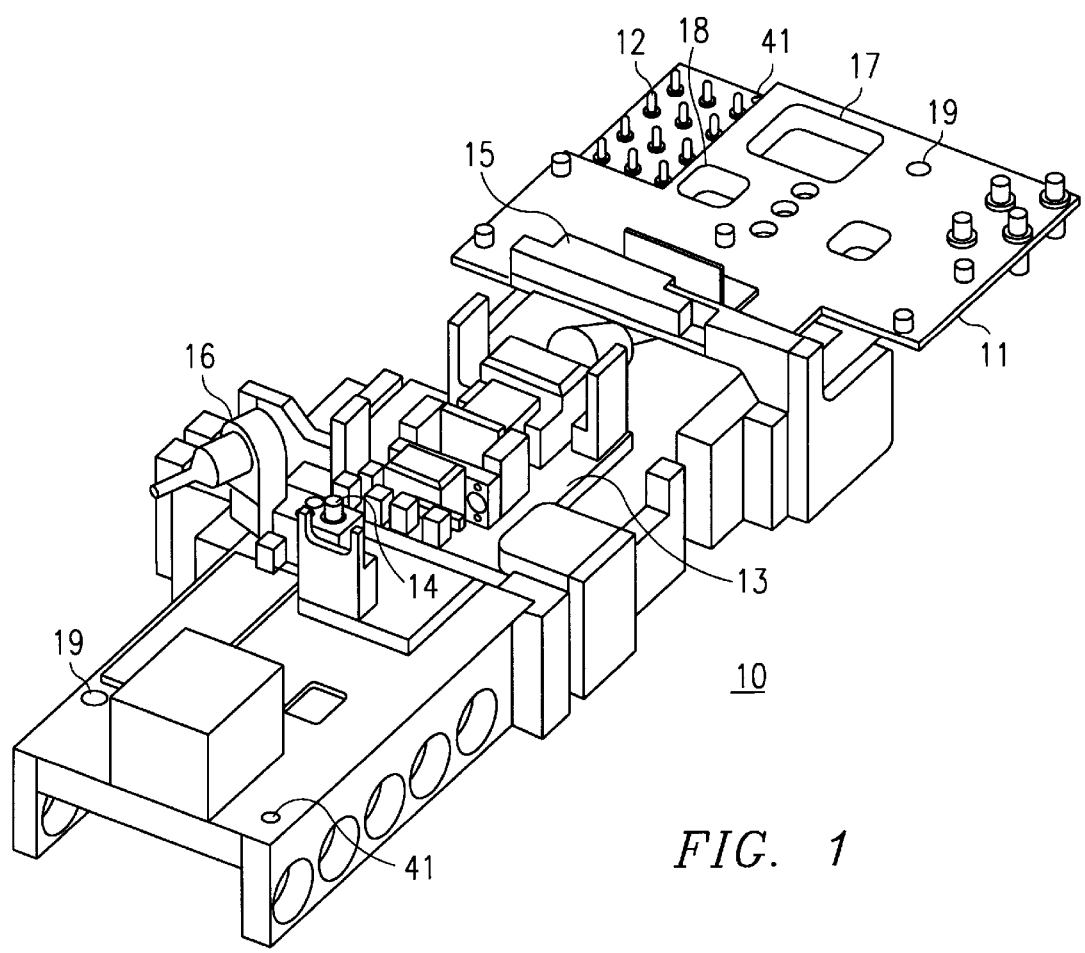
FIG. 1 depicts the inventive adapter mechanism.

FIG. 1 depicts the inventive adapter mechanism 10. Adapter 10 includes base plate 11 upon which other elements are secured. Pneumatic connectors 12 are located in the rear of the adapter 10. Each of connectors 12 comprises double male connectors, one on top of plate 11 and one underneath plate 11. The connections underneath couple via quick disconnects to female connectors located on fixture 20 of FIG. 2, and the connections on top couple with the actuators. Alternatively, female connectors can be located under plate 11 which couple to male connectors located on fixture 20. With either arrangement, the connection between adapter 10 and fixture 20 occurs when the adapter is installed. In other words, as the adapter is pushed into the fixture, connectors 12 couple with complementary connectors 22. Each connector 12 has an O-ring seal to prevent air from leaking. The lines (not shown for reasons of simplicity) from the connectors 12 are routed down through hole 18 to the various actuators. Thus, the lines do not interfere with the loading and unloading process of the DUTs and the operations of the actuators during testing.

Figure 3:
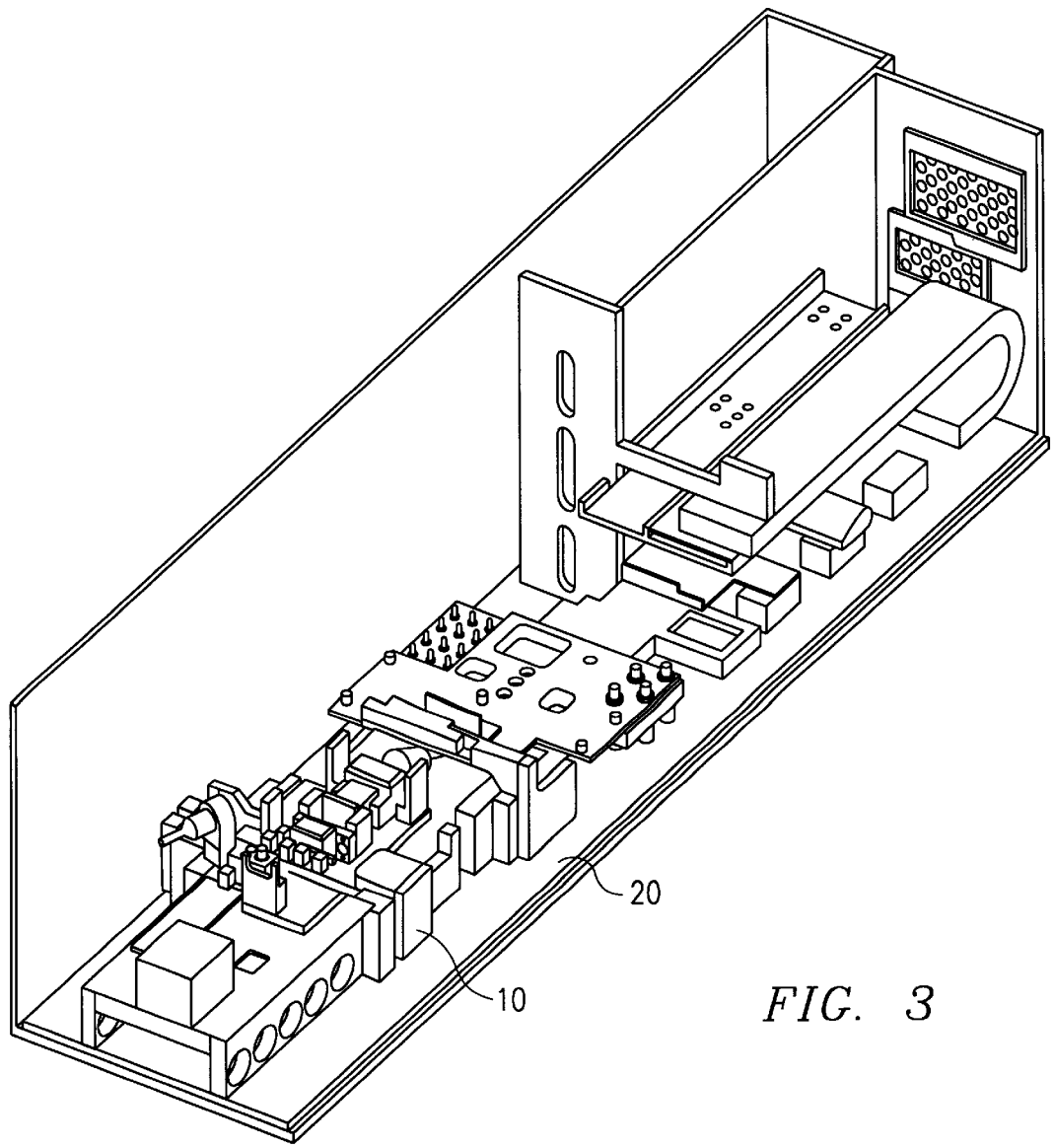
FIG. 3 depicts the adapter of FIG. 1 in the drawer fixture of FIG. 2.

Adapter 10 is coupled to fixture 20 via holes 19. Holes 19 are hardened steel bushing, each bushing receives an alignment pin 23 located on drawer 21 of fixture 20. Adapter 10 also includes holes 41 into which ¼ turn fasteners are placed which secure adapter 10 to fixture drawer 21. Other type fasteners could be used. Thus, to change adapters, the fasteners are removed and the adapter is pulled out. This simultaneously separates connectors 12 from receivers 22. The replacement adapter is then aligned in the drawer, via the alignment pins 23 and bushing 19, and installed. This simultaneously connects the connectors 12 and the receivers 22. The fasteners are then installed to secure the adapter. FIG. 3 depicts adapter 10 connected to fixture 20.

The adapter has nest area 13 to secure the DUT (not shown). Although not shown in the adapter of FIG. 1, pneumatic actuators can be used in nest area 13 capture and hold the DUT. Slide 14, which is pneumatically actuated, moves vertically to engage the DUT for testing. Slide 15 moves horizontally to engage the DUT for testing. Slides 14 and 15 are used to connect DUT to power. Connector 16 is a pneumatically actuated connector which electrically couples with the DUT. The number, function, and location of the actuators is by way of example only, as the precise number, function, and placement depends upon the testing requirements of the particular DUT and ATM.

Figure 2:
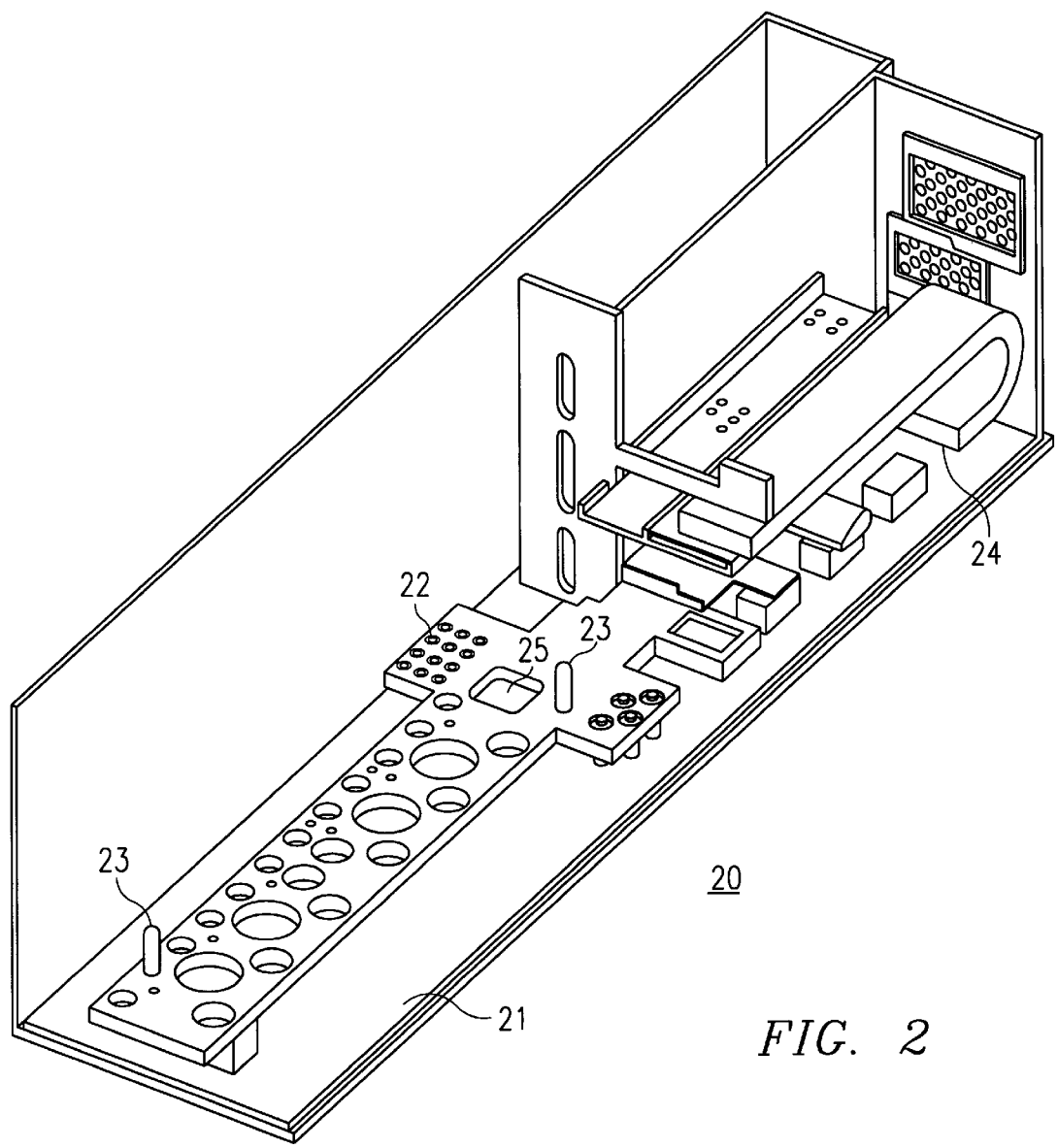
FIG. 2 depicts a drawer type fixture for an automatic testing machine.

FIG. 2 depicts fixture 20 with drawer 21. Fixture 20 includes pneumatic receivers 22 or female connectors which are complementary to the male connectors 12. Fixture 20 also includes alignment pins 23 which are used to align adapter 22 during loading of the adapter. Fixture 20 uses cable router 24 to bundle the pneumatic air hoses which lead to receivers 22.

Adapter 10 has portion 17 used for electrical connectors (not shown). These connectors are spring loaded pins that engage straight down onto a printed circuit board 25 having an array of test pads, which would be located on fixture 20. The electrical connection would be made (or broken) simultaneously with the installation (or removal) of the adapter. The adapter also may hold various transducers (not shown) to communicate with or measure the DUT, including but not limited to infrared communications, vibrations sensors, acoustic microphones, DUT presence sensors, color detectors, RF couplers, etc.

During operation of the ATM, a DUT is loaded into adapter 10 of fixture 20. Completion of loading is communicated to the ATM via the loading robot. The ATM begins to secure the DUT and power up the DUT before the drawer has closed, saving cycle time. Once the drawer is closed, testing begins, typically with calibration of the DUT and sensors. Other testing such as operational testing or RF testing is performed with the drawer closed. Once testing is completed, the ATM may open the drawer while releasing and powering down the DUT, saving more cycle time.

Note that the actuators may be powered by electricity or hydraulic fluid rather than by pneumatic air. Thus, the connectors and lines, as described above with regards to pneumatic air, would allow the passage of either electricity or hydraulic fluid from the fixture to the actuators through the adapter. Hydraulic fluid would require a return line for the fluid to allow the fluid to flow. Electricity would either require a return line or having the adapter grounded to the fixture, to allow the flow of electrical current. Return lines would follow the same path through the adapter as the lines bringing the resource. Note that various combinations of the three power types may be required to operate all actuators on the adapter.

Although the present invention and its advantages have been described in detail, it should be understood that various changes, substitutions and alterations can be made herein without departing from the spirit and scope of the invention as defined by the appended claims.

What is claimed is:

1. An adapter that holds a device to be tested in an automatic testing machine, wherein the adapter is to be coupled to a drawer mechanism of a fixture of the machine, the adapter comprising:

at least one actuator operated by pneumatic air to engage said device to said adapter for testing; and means for releasably attaching the adapter to the drawer mechanism.

2. The adapter of claim 1, further comprising:

at least one connector to receive the pneumatic air from the fixture.

3. The adapter of claim 2, further comprising:

at least one line to distribute the pneumatic air from the one connector to the one actuator.

4. The adapter of claim 3, wherein a hole in the adapter allows the one line to pass through the adapter and run beneath the adapter to the one actuator.

5. The adapter of claim 1, wherein said engaging said device includes a function selected from the group of functions consisting of:

operating interfaces of the device, powering up the device, connecting ports of the device to the adapter, and securing the device to the adapter.

6. The adapter of claim 1, wherein the means for releasably attaching the adapter to the drawer mechanism comprises:

a fastener which is placed into at least one hole in the adapter wherein said fastener secures the adapter to the drawer mechanism.

7. The adapter of claim 1, wherein the means for releasably attaching the adapter to the drawer mechanism comprises:

at least one bushing hole into which is placed an alignment pin from the drawer mechanism.

8. The adapter of claim 1, wherein:

the one actuator is connected to the pneumatic air via the drawer mechanism such that the one actuator receives the pneumatic air when the drawer mechanism is in open and closed positions.

9. An adapter that holds a device to be tested in an automatic testing machine, wherein the adapter is coupled to a drawer mechanism of a fixture of the machine, the adapter comprising:

at least one actuator operated by pneumatic air to engage said device to said adapter for testing;

at least one connector to receive the pneumatic air from the drawer mechanism;

at least one line to distribute the pneumatic air from the one connector to the one actuator; and means for releasably attaching the adapter to the drawer mechanism;

wherein the one actuator is connected to the pneumatic air via the drawer mechanism such that the one actuator receives the pneumatic air when the drawer mechanism is in open and closed positions.

10. The adapter of claim 9, wherein a hole in the adapter allows the one line to pass through the adapter and run beneath the adapter to the one actuator.

11. The adapter of claim 9, wherein said engaging said device includes a function selected from the group of functions consisting of:

operating interfaces of the device, powering up the device, connecting ports of the device to the adapter, and securing the device to the adapter.

12. The adapter of claim 9, wherein the means for releasably attaching the adapter to the drawer mechanism comprises:

a fastener which is placed into at least one hole in the adapter, wherein said fastener secures the adapter to the drawer mechanism.

13. The adapter of claim 9, wherein the means for releasably attaching the adapter to the drawer mechanism comprises:

at least one bushing hole into which is placed an alignment pin from the drawer mechanism.

14. A method for changing a first adapter that holds a device to be tested in an automatic testing machine for a second adapter, wherein the first adapter is coupled to a drawer mechanism of a fixture of the machine, the method comprising the steps of:

removing a fastener which is connected to the drawer through a fastener hole in the first adapter;

removing the first adapter from the drawer and simultaneously disconnecting at least one pneumatic air connector, which is located on the first adapter and received pneumatic air from the fixture which is used to operate at least one actuator on the first adapter;

aligning the second adapter in a predetermined position with respect to the drawer by passing alignment pins located on the drawer through corresponding bushing holes on the second adapter;

installing the second adapter and simultaneously connecting at least one pneumatic air connector, which is located on the second adapter to the fixture for receiving pneumatic air from the fixture, which is used to operate at least one actuator on the second adapter; and inserting the fastener through a fastener hole in the second adapter and connecting the fastener to the drawer.

15. The method of claim 14, wherein:

the second adapter includes a hole which allows the one line to pass through the second adapter and run beneath the second adapter to the one actuator of the second adapter.

16. The method of claim 14, wherein the one actuator of the second adapter performs a function selected from the group of functions consisting of:

operating interfaces of the device, powering up the device, connecting ports of the device to the second adapter, and securing the device to the second adapter.

17. The method of claim 14, wherein:

the one actuator of the second adapter is connected to the pneumatic air via the drawer mechanism such that the one actuator receives the pneumatic air when second adapter is installed in the drawer mechanism.

* * * * *